United States Patent [19]

Fleck

[11] Patent Number: 4,529,855
[45] Date of Patent: Jul. 16, 1985

[54] MICROWAVE RADIATION DETECTOR

[76] Inventor: Henry Fleck, 750 Kappock St., Riverdale, N.Y. 10463

[21] Appl. No.: 655,354

[22] Filed: Sep. 28, 1984

Related U.S. Application Data

[63] Continuation-in-part of Ser. No. 367,485, Apr. 12, 1982, abandoned.

[51] Int. Cl.$^3$ .............................................. H05B 6/64
[52] U.S. Cl. ........................ 219/10.55 D; 219/10.55 E; 324/96
[58] Field of Search ................. 219/10.55 D, 10.55 E, 219/10.55 F, 10.55 R; 324/95, 96, 121 R, 123 R

[56] References Cited

U.S. PATENT DOCUMENTS

| | | | |
|---|---|---|---|
| 3,316,380 | 4/1967 | Pansing | 219/10.55 F |
| 3,679,908 | 7/1972 | Mazza | 219/10.55 D |
| 3,701,872 | 10/1972 | Levinson | 219/10.55 E |
| 3,748,424 | 7/1973 | Fitzmayer | 219/10.55 D |
| 3,749,875 | 7/1973 | Fitzmayer et al. | 219/10.55 D |
| 3,753,003 | 8/1973 | Mazza | 219/10.55 D |
| 3,777,099 | 12/1973 | Levinson | 219/10.55 E |
| 3,941,967 | 3/1976 | Sumi | 219/10.55 E |
| 4,088,863 | 5/1978 | Jellies | 219/10.55 E |

FOREIGN PATENT DOCUMENTS 1133048  7/1962  Fed. Rep. of Germany ... 219/10.55 R Primary Examiner—Roy N. Envall, Jr.
Assistant Examiner—M. M. Lateef

[57] ABSTRACT

A self-contained microwave radiation detector is adapted for use in a microwave oven. The detector includes a non-metallic electrodeless sealed chamber in which a microwave-responsive gas mixture, such as a mixture of neon and argon, is located. In response to excitation by the microwaves radiation in the microwave oven, the gas mixture sustains a white glow which provides a positive indication that the microwave oven is in operation irrespective of the operation of other indicators. The non-metallic and electrodeless construction of the detector allows it to remain within the oven during extended periods of operation without damage to the oven or the detector. Also described is an improved microwave oven cooking utensil into which the detector has been integrated. The improved utensil includes a platform for receiving the food to be cooked, a base for supporting the platform in the oven and a microwave heater adjacent the platform, the heater being formed by a sealed chamber containing a microwave-responsive gas or gas mixture. In the presence of microwave energy in the oven, the gas or gas mixture sustains a glow which heats the platform and food thereon as well as provides a visual indication, associated with the utensil, of the presence of microwave energy.

12 Claims, 7 Drawing Figures

MICROWAVE RADIATION DETECTOR

This is a continuation-in-part of application Ser. No. 367,485 filed Apr. 12, 1982 now abandoned.

This invention relates to the field of microwave sensing apparatus and in particular to a microwave detecting device able to be utilized with a microwave oven to provide a positive visual indication that the oven microwave generator is energized, notwithstanding the existence of other indicating means or radiation safeguards, which device, in one form, may be incorporated in a cooking utensil used for holding food, so that a visual indication of presence of cooking energy may be associated with the utensil during cooking.

Over the past several years, there has been an explosive growth in the number of domestic and industrial microwave ovens. Federal Safety requirements covering such microwave ovens are found in the regulations promulgated pursuant to the Radiation Control For Health And Safety Act of 1968, 42 U.S.C. 2636 et seq. As a result of these regulations, microwave oven manufacturers provide a series of safeguards to prevent the opening of the oven door while the microwave magnetron is in operation. In addition, indicating devices, such as a bell or the like, are often provided to provide an aural indication of the end of magnetron energization.

Notwithstanding these safeguards, there has been an increasing incidence of radiation burns caused by the failure of microwave oven safeguard systems to shut down the magnetron when the door is open, or at the announced end of a cooking cycle. Thus there are many recorded instances of microwave radiation burns to hands, arms and faces as a result of the microwave user opening the door and coming into close proximity to the operating microwave source in the oven. A burn resulting from exposure to microwave radiation at the levels produced by a microwave oven in serious, painful and long-lasting. A typical microwave radiation burn produces little or no surface burn, yet causes severe damage to motor, sensory and sympathetic nerve fibers within the area exposed to the radiation. This damage is essentially permanent, and further sensitizes the remaining nerve fibers to radiation. It has been found in some cases that, after a microwave radiation burn, the patient cannot be exposed to even moderate sunlight without experiencing pain. Many, if not all of these injuries could be avoided if a freestanding, independent means for indicating the presence of microwave radiation, not relying upon oven circuitry, was provided within the microwave oven chamber.

Conventional microwave sensing apparatus typically include a microwave sensing antenna as well as relatively complicated circuitry designed to produce a aural or visual indication of the presence of such radiation. For example, U.S. Pat. No. 4,199,716 to J. Reindel of Apr. 22, 1980 discloses a microwave hazard alarm that requires the use of a battery powered amplifier. Similarly, U.S. Pat. No. 4,032,910 to Hollway et al of June 28, 1977 discloses a device including an antenna and diode resistor array.

Further examples of radiation detectors used in connection with microwave ovens are found in U.S. Pat. Nos. 3,679,908 and 3,753,003 issued to L. Mazza respectively on July 25, 1972, and Aug. 14, 1973. In these patents, Mazza describes microwave radiation leakage detectors which feature use of a gas lamp, the resistance of which changes in response to microwave energy. The lamp is electrically connected in a circuit capable of interrupting power to the oven microwave generator, and is physically located externally of the oven chamber, proximate the oven door. Radiation escaping the oven when the door is opened or closed causes the gas lamp resistance to drop, and the power to the microwave generator to be interrupted. While such devices are generally useful outside the microwave cavity of an oven, for example to detect leakage radiation, they are unsuitable for continuous monitoring of microwave radiation within the oven cavity, since the presence of wires and other metal-containing structures distorts and affects the microwave reflecting characteristics of the oven chamber, and can lead to improper cooking or destruction of the relatively sensitive magnetron tube.

Other microwave leakage detectors, such as that disclosed in U.S. Pat. No. 4,272,765 to G. White of June 9, 1981, are of relatively large size and, while able in theory to be utilized within the oven chamber, require submerging in water or a similar liquid to absorb some microwave energy which would otherwise overload and destroy the sensing apparatus. The need for such a container further prevents utilization of the indicator apparatus during actual cooking.

It is also known that a neon lamp will produce a glow in the presence of microwave energy. German Auslegesschrift No. 1,133,048 issued July 12, 1982, to Siemens-Electrogerate A.G. proposes use of a neon lamp selectively located in a high frequency induction oven such that the lamp will glow to indicate presence of the oven's high frequency energy. Additionally, U.S. Pat. No. 4,088,863 issued May 9, 1978, to D.A. Jellies proposes use of a neon bulb responsive to microwave energy for use in a microwave oven food thermometer which glows during at least part of the thermometer's operating cycle. Such devices, however, typically require particular constructions including external leads or other inductive means to assist ignition of the glow which may affect even operation. Additionally, because of the need for ignition assitance, the operation of such devices would be expected to be sensitive to their location in the oven, as in some parts of the oven the microwave field strength may not sufficient to provide reliable operation. Additionally, the light emitted from a convention neon bulb would be expected to be pink, and not provide the degree of contrast that a white light would provide against a dark oven cavity.

As noted, one of the principal safety problems associated with microwave cooking is the absence of a visual indication of the presence of cooking energy. Even with the use of a visual detector located in the oven itself, there is an absence of the traditional association of energy with the food being cooked. In the common gas stove, for example, one can immediately see the flame under the pot and sense the danger of potential injury. So also with an electric range whose heating elements glow when on, there is an immediate association of heat with the principal item of interest, the food, and with that association the indication of the potential for burns.

In the case of a microwave oven, even if a visual indicator such as a detector is located in the oven, the operator must be educated to the association of detector activity and danger. Such a device, therefore, still runs the risk of failing to prevent injury where the oven user is inattentive or unaware, as for example a busy housewife or a child.

It therefore would be desirable to incorporate a visual indicator as an integral part of microwave cooking utensils. In this way, the traditional association of visual indication of heat energy and utensil during cooking could be maintained.

While specialized microwave coking utensiles have been proposed for browing and assisting cooking of food in microwave ovens, such utensiles typicaly fail to provide for visual microwave detection within the utensil. For example, U.S. Pat. No. 3,941,967 issued Mar. 2, 1976 to M. Sumi et al describes a utensil featuring a platform for receiving and supporting food to be cooked, a microwave responsive heat generator located beneath the platform for heating the platform and food thereon, a base for supporting the platform in the oven and a heat insulator located between the heater and the base for impeding the flow of heat from the heater to the base in order to safeguard the oven floor. In operation, heat produced by the generator in response to microwave energy is transferred to the platform and the food thereon to brown and assist cooking. No means, however, are provided for detecting or visually indicating the presence of the microwave energy.

While there are microwave browing and cooking utensils of a type similar to that described by Sumi et al which use a heat generator that will provide a visual indication when sufficiently hot, such utensils are not intended or capable of providing the substantially immediate visual response to the presence of microwave energy which would be required of a safety detector. Particularly, U.S. Pat. Nos. 3,701,872 and 3,777,099, issued respectively Oct. 10, 1972, and Dec. 4, 1973, to M.L. Levinson, describes a utensil including a platform, heater, base and insulator similar to Sumi et al wherein the heater is composed of a bed of resistive particles with glow and produce sparks in response to microwave energy. However, in the Levinson utensil, the heater is embedded in an insulator and covered over the major part of its potentially visible surface with a metallic heat conducting plate. This substantially limits visibility of the particles which are said to glow when the heater reaches temperatures in excess of one thousand degrees fahrenheit.

Accordingly, in the Levinson utensil, the ability to observe the visual responsive to the microwaves is significantly limited by the utensil's construction. Additionally, as described by Levinson, the full visual effect of the response is delayed until the heater bed is hot enough to glow. Therefore, the Levinson utensil would be unable to provide visual mircowave detection consistent with a safety device.

It is therefore a purpose of the present invention to provide an essentially non-metallic microwave sensing apparatus which may be utilized within the microwave oven chamber without affecting performance of the oven.

Another object of the present invention is to provide a detector which may remain within the oven cavity during operation thereof without fear of destruction of the device or of the microwave oven apparatus.

It is yet a further object of the present invention to provide a microwave detector that provides a high visibility white light in response to the microwave energy within the oven cavity.

Yet another object of the present invention is to provide such a microwave indicator device which provides a positive indication of microwave output irrespective of the operation or operability of the oven safeguards.

A still further object of the present invention is an improved microwave cooking utensil into which a detector capable of providing a visual indication of the presence of microwave energy, as described herein, may be integrated so as to maintain the traditional association of cooking energy, and the potential for injury, with the food being cooked.

In accordance with the above and other objects, the present invention includes a non-metallic electrodeless sealed chamber in which a material sensitive to microwave radiation is placed. The sealed chamber is mounted within the microwave oven and remains there at all times. When the radiation-sensitive material detects the presence of microwave radiation a characteristic visual glow is emitted, which glow can be observed through the oven door as well as directly when the door is opened. Such an indicator operates independently of any other sensing apparatus that may be present, and provides a continuous indication of the presence of microwave energy in the oven chamber.

In particular, it has been found that noble gases, specifically neon and argon, when retained in a sealed glass chamber produce a visible light which provides a visual indication of the presence or absence of microwave energy in the oven. A mixture of neon and argon has been found preferable since the mixture has been found to readily ignite and operate at acceptable temperatures while producing a highly visible white light. At comparable volumes and pressures, neon alone was found to more readily ignite than argon, but run hotter and produce a pinkish light of greater intensity than argon's white light. A mixture of neon and argon, however, was found to exhibit the ease of ignition of neon along, without the associated high operating temperatures which require high specialized glasses to contain and threaten detector life. Additionally, while the mixture of neon and argon was found to produce less light intensity than neon alone, the light was greater in intensity than argon and was the more desirable high contrast white light associated with argon.

Also in accordance with the above and other objectives, the present invention includes the incorporation of the detector described in a cooking utensil for use in a microwave oven. The utensil features a platform for receiving food, a heater, responsive to microwave energy for heating the platform and the food thereon and a base for supporting the platform in the oven as is known in the art. However, in accordance with this invention, the utensil heater is formed as a sealed chamber containing a gas which supports a heat-generating visible glow discharge in response to the microwave energy in the oven. In the this embodiment, at least one wall, or part thereof, of the chamber is microwave and optically transparent or transmissive so that the glow can be ignited and observed. In preferred form, the utensil is made of an electrically insulating, optically transparent material, e.g. glass which permits the entire volume of the heater, and the gas within, to be monitored. In the case of the cooking utensil, it may be acceptable to use any gas, or mixture of gases, that supports a glow, as the volume of the heater and utensil materials may be adjusted to accommodate the character of the discharge more readily than the detector alone. However, as in the case of the detector alone, whre white light, ease of ignition and lower temperature per unit volume is desired, a mixture of neon and argon is preferred. Also in preferred form, the utensil may be further provided with a thermal insulator located between the heater and the base to impede the transfer of heat from the heater to the oven.

Other features and objects of the present invention will be more readily appreciated by reference to the following, detailed description of a preferred, but nonetheless illustrative embodiment of the present invention with reference to the accompanying drawings wherein.

Figure 1:
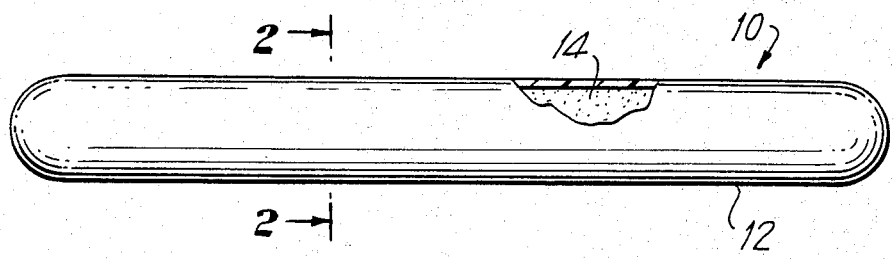
FIG. 1 is a plan view of a microwave radiation detector in accordance with the present invention.
Figure 2:
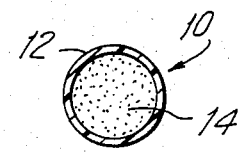
FIG. 2 is a sectional view of the detector shown in FIG. 1 taken along line 2—2.

Referring to the figures, the microwave detector for use in a microwave oven in accordance with this invention is shown in FIG. 1. As seen there, detector 10 includes a sealed electrodeless tubular chamber 12 containing an appropriate microwave-sensitive gas 14. In a preferred embodiment chamber 12 is circular in cross section, as shown in FIG. 2, and may be approximately from 4 to 8 inches long and from approximately ⅜ to ¾ inches at its inside diameter. The tube, typically from approximately 40 to 50 thousanths of an inch in wall thickness, is made of a microwave and optically transparent of transmissive material capable of withstanding the temperature associated with glow discharge of gas 14 in the presence of microwaves, as for example lead-based or borosilicate glass. Since lead-based glasses have softening temperatures of approximately 640 degrees centigrade, in cases where higher temperatures are expected, borosilicate glasses having softening temperatures of 750 degrees centigrade and higher are preferred.

In the course of experimenting with the detectors as described above, it was found that as the volume of the detector increased, the temperature of the chamber increased. It was further found that the temperature of the chamber was dependent upon the pressure and the type of gas used as will be more fully described hereafter. Therefore, for large volume detectors, borosilicate glasses, available from the Corning Glass Company under the trademark Pyrex, are preferred.

In accordance with this invention, it was found experimentally that neon, argon and a mixture of neon and argon contained in chamber 12 would produce a visible glow discharge of varying character when the detector was subjected to the cooking energy of a conventional home microwave oven. In particular, a series of detectors were prepared containing neon or argon or a mixture of approximately 50% neon and 50% argon at various pressures. Each detector was then inserted alone into the a home microwave oven having a 600 watt rating and a fundamental microwave frequency of 2.45 gigahertz. Thereafter, the oven was turned on and the light intensity, color and temperature of the resulting glow noted. The detectors were all of the same length, approximately 6 inches, and with the exception of the neon, argon mixture, the same diameter, approximately 21/32 inch inside diameter. The neon, argon mixture detectors were approximately 27/64 inch in inside diameter. It would, therefore, be expected the neon, argon mixture detector readings would be higher if the larger diameter tubes are used.

The results of the tests are shown in TABLE I.

TABLE I

| Sample No. | Gas | Pressure mm/hg | Intensity candles/ft$^2$ | Temp. degrees C. | Color |
|---|---|---|---|---|---|
| 1 | neon | 2.0 | 1.7 | 145 | pink/white |
| 2 | neon | 5.0 | 5.0 | 200 | pink/white |
| 3 | neon | 10.0 | 5.0 | 200 | pink/white |
| 4 | neon | 15.0 | 3.3 | — | pink/white |
| 5 | neon | 20.0 | 0.8 | — | pink/white |
| 6 | argon | 2.0 | 0.052 | 90 | white |
| 7 | argon | 20.0 | 0.2 | 120 | white |
| 8 | neon/argon | 1.0 | 0.4 | 130 | white |
| 9 | neon/argon | 2.0 | 0.8 | 140 | white |
| 10 | neon/argon | 10.0 | 0.8 | 150 | blue/white |
| 11 | neon/argon | 20.0 | 0.8 | 170 | blue/white |

As shown in TABLE I, the neon detector, samples 1 to 5, while producing more light intensity than argon or the neon, argon mixture, ran substantially hotter than the other detectors. In fact, the high pressure neon samples, 4 and 5 experienced melting of the lead-based glass chambers, and temperature measurements could not be taken.

The argon samples 6 and 7 ran the coolest and produced a most desirable high contrast white light. However, the intensity of the argon light was substantially less than that of neon detectors of comparable pressure. Additionally, the argon detectors were more difficult to ignite, and requiring placement in regions of high field intensity in the oven for operation.

The mixture of approximately 50% neon and 50% argon, on the other hand provided the preferred overall performance. The light intensity of the detectors containing the mixture was substantially greater than that of the argon detectors, even though detectors containing the mixture were somewhat smaller than the argon detectors. Further, chamber temperatures for the mixture were substantially less than that of neon alone, thereby limiting the thermal stress on the glass chambers of the detectors containing the mixture. Additionally, the detectors containing the mixture produced white light, but did not show the reluctance to ignite evidenced by argon alone. Rather they showed the ease of ignition of neon alone. Accordingly, in view of these results, the mixture of approximately 50% neon and 50% argon was the gas of preference.

While the exact mechanism of the discharge in the mixture is not known, it is hypothesized that the neon in the mixture acts as a starter for the argon which later dominates the process. What is surprising is that the mixture ameliorates the disadvantages of both gases alone while retaining at least most of their advantages.

The shape of indicator 10 is not critical. While it has been found that the tubular shape shown in the figures produces highly acceptable results, the tube may be rectangular or square, rather than round in cross-section and may be formed into the shape of a torus or other shape instead of the rod depicted. As noted, the active volume should be chosen with consideration for the acceptable detector operating temperature and the available power from the oven. It has been found for microwave ovens in the 600 watt range that a 4 to 8 inch tube of between approximately ⅜ to ¾ inch inside diameter provides an extremely vivid and noticeable glow over a wide range of ambient light conditions, thus insuring that the threat of microwave radiation is observed.

Figure 3:
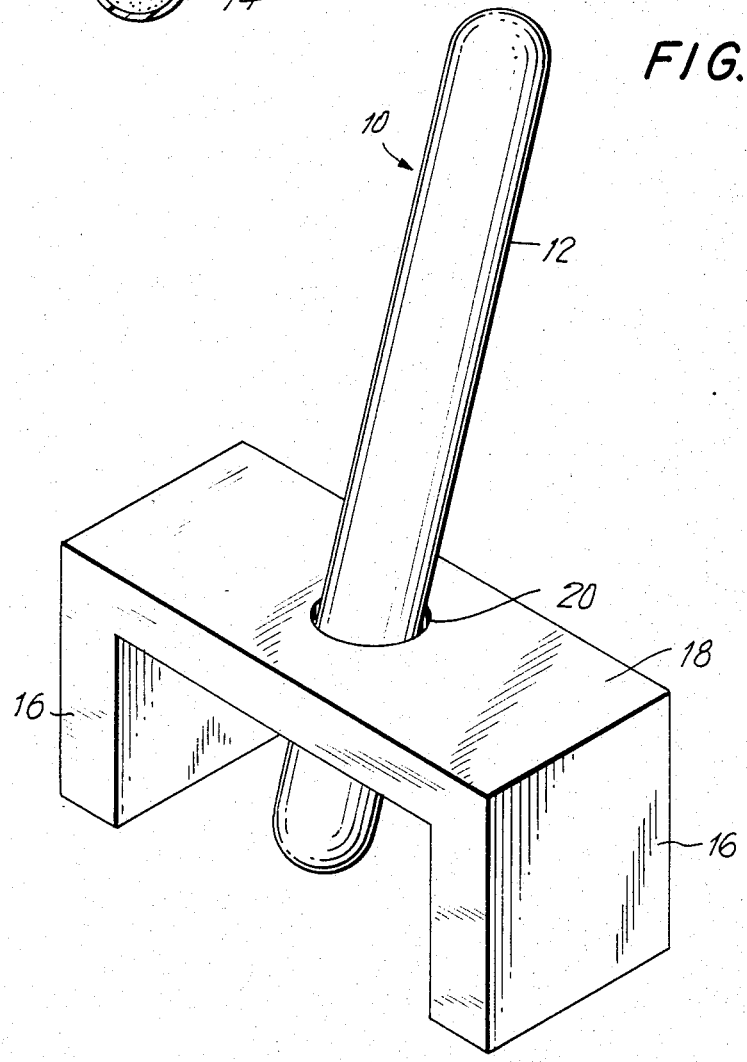
FIG. 3 is a perspective view of the detector in accordance with the present invention mounted in an appropriate holder.

FIG. 3 shows discloses a typical mounting structure for the radiation sensing tube which allows the tube to be located on the base surface of the oven cavity. Such a stand may be constructed of any appropriate non-metallic material, and is preferentially manufactured of a material that can withstand the operating temperature of chamber 12. It includes depending legs 16 and horizontal table surface 18 through which vertical bore 20 extends. Chamber 12 is simply inserted within the bore, the bottom end of the chamber resting upon the oven surface. Such a stand is especially useful when a detector having a round cross-sectional configuration is utilized, to prevent rolling of the device across the oven floor.

Since neither detector nor holder include any metallic material, their presence within the microwave oven does not affect the reflection characteristics of the oven and therefore does not contribute to magnetron failure or uneven cooking. The use of a rigid, heat resistant material for chamber 12, allows the device to remain within the oven chamber during extended periods of use without fear of damage. Further, the lack of heat sensitive parts or movable elements insures that response to microwave radiation will occur under a wide variety of operating conditions, and without fear of over-exposure and damage to the device.

In operation, the microwave detector is merely placed within the oven chamber, preferably in a position which may be observable both through the oven door and by the user when the oven door is open. While some experimentation may be necessary to find the optimum position to insure the brightest glow, since radiation dispersion is not always completely uniform throughout the chamber, it has been found that a useful and observable indication can be produced in almost any location. In general, however, for best visibility, it has been found that a location in one of the front corners of the oven is preferred.

The indicator of the present invention provides a continuous observable indication of the present of microwave energy within the oven chamber irrespective of the operation or failure of other indicating devices which may be utilized. In this regard, it serves as a consistent indicator of oven operation, and provides a warning function to call attention to the fact that microwave energy exists irrespective of the fact that the oven door may be open.

As noted previously, one of the principal safety problems associated with microwave cooking is the absence of a visual indication of cooking energy. Even with the use of a detector as described above, there is an absence of the traditional association of energy with the food being cooked. By virtue of the physical separation of the indicator and the utensil, there is no "flame under the pot." To solve that problem, another aspect of this invention includes the integration of the detector described herein with a cooking utensil. The utensil resulting is thereby improved by permitting visual connection of the indication of energy with the utensil so as to reestablish the traditional association.

Figure 4:
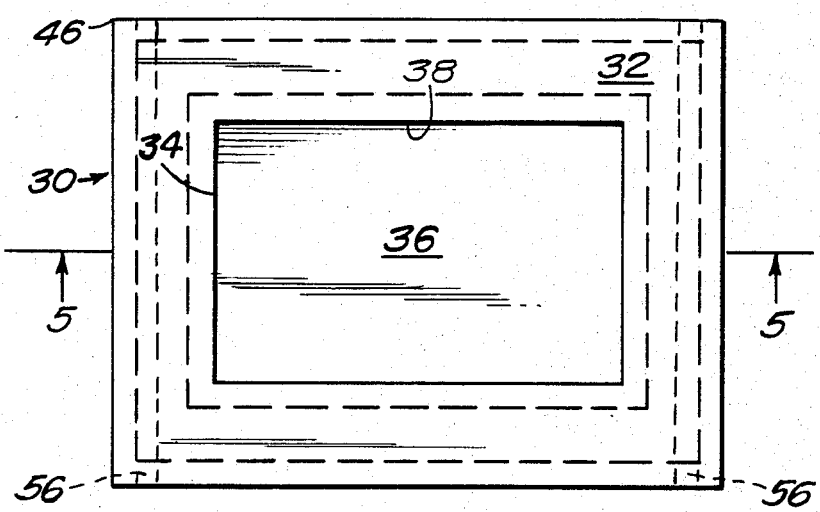
FIG. 4 is a top plan view of a first embodiment of the improved microwave cooking utensil in accordance with this invention.
Figure 5:
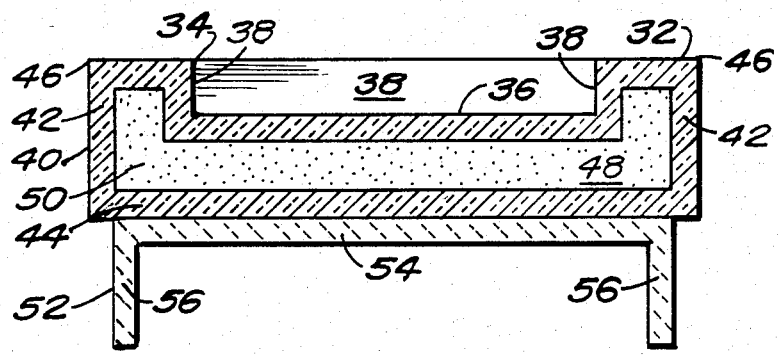
FIG. 5 is a section view of the improved utensil shown in FIG. 4 taken along line 5—5.
Figure 6:
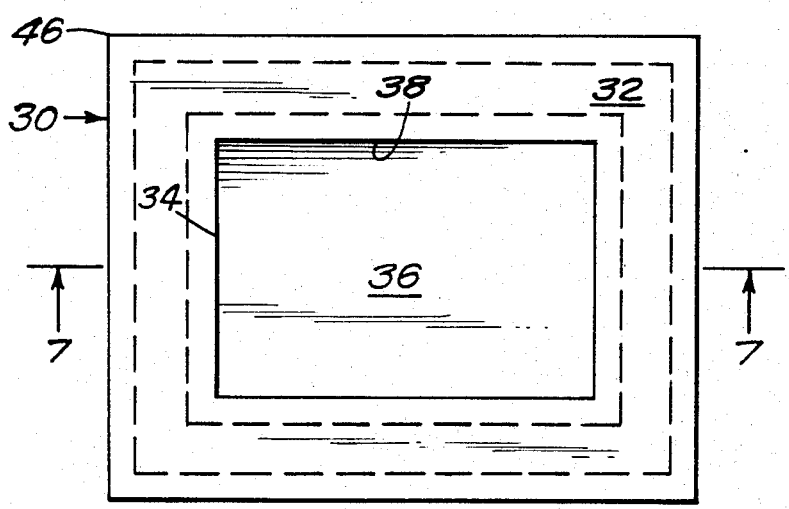
FIG. 6 is a top plan view of a second embodiment of the improved microwave cooking utensil in accordance with this invention.
Figure 7:
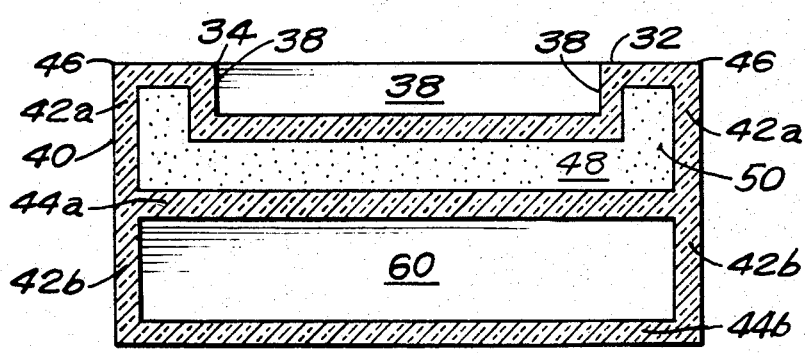
FIG. 7 is a section view of the improved utensil shown in FIG. 6 taken along line 7—7.

In accordance with this invention, the improved microwave cooking utensil incorporating a microwave detector is shown in a first preferred embodiment in FIGS. 4 and 5, and in a second preferred embodiment in FIGS. 6 and 7. As seen in FIG. 4, in the first embodiment, the utensil 30 features a platform 32 for receiving the food to be cooked. Platform 32 may include a recess 34 having a bottom wall 36 and sidewalls 38 for receiving and retaining food placed in the utensil.

For ease of depiction, platform 32 and recess 34 are shown rectangular in shape, with recess 34 centrally located for efficient use of space. As will be appreciated by those skilled in the art, any convenient shape may be used, particularly where specialized foods are to be accommodated. Further, the height of sidewall 36 may be adjusted to suit the particular application. Moreover, bottom wall 36 may be further patterned to allow receipt of the food, as for example with notches, partitions or pockets to receive eggs, bacon etc.

As best seen in FIG. 5, utensil 30 further includes a base 40 having lower wall 42 and sidewalls 44 for supporting platform 32. As shown, base 40 is configured to have a shape consistent with platform 32, and as shown is rectangular. In accordance with this invention, base 40 is joined in sealing relation with platform 32 at the perimeter 46 of platform 32, and is spaced from the remainder of platform 32 to define a sealed chamber 48. Accordingly, platform 32 defines the upper wall of chamber 48, and base sidewalls 42 and lower wall 44 the sidewalls and lower wall respectively of chamber 48.

Continuing with reference to FIG. 5, sealed chamber 48 is filled with a microwave-sensitive gas 50 which will glow discharge when subjected to microwave energy. Gas 50 may be introduced to volume 48 in any convenient manor, as for example by providing a sealable inlet, not shown, or some other suitable means.

As described above, gas 50 is preferably neon, argon or a mixture of neon and argon. As also noted above, the selection of the gas, its pressure, and volume determine the amount of illumination and heat generated during glow. In the case of the utensil, the specific parameters will vary depending upon the size of the utensil and the food to be accommodated. For example, where limited heat is desired to assist cooking, the chamber sidewall, i.e. base sidewall 42 may be limited in height, particularly where the area of platform 32 is required to be large to accept the food to be cooked. Further, where the heat generated is to be limited, argon may be the gas of preference where the utensil dimensions are less flexible.

In the case where heat is desired, as for example where browing of the food is sought, the volume of chamber 48 may be increased and the preferred gas may be neon.

Continuing with reference to FIG. 5, in order for the glow of gas 50 to be initiated and observed, at least one wall, or part thereof, of chamber 48 must be both microwave and optically transparent or transmissive. In preferred form, the entire utensil may be made of a unitary construction of, for example, lead-based or borosilicate glass depending on the operating temperatures expected.

In order to protect the oven floor from possible damage due to heat transfer from chamber 48, and to retain heat for platform 32, a stand 52 may be provided for supporting utensil 30. Stand 48 may have any convenient form, as for example, it may include a shelf 54 joined to legs 56 as shown or be simply a block of material. To imped heat flow from chamber 48, stand 52 is preferably made of a heat insulating material which will not disturb the microwave field of the oven, or excessively absorb energy.

In operation, when the utensil containing food is placed in a microwave oven, and the oven energized, gas 50 will be caused to glow and transfer heat to the food in utensil recess 34 through walls 36 and 38. Further, the glow will be visible through the transparent sidewalls or in the preferred form where the utensil is made all of glass, over the entire utensil. This arrangement thereby reestablishes the traditional association of cooking energy with the utensil and gives the user a positive indication of the presence of microwaves and their potential danger.

Continuing with reference to the figures, FIGS. 6 and 7 show a second embodiment of the improved utensil. As best seen in FIG. 7, where like elements to the embodiment shown in the FIG. 4 are referred to with like numerals, a heat insulating stand has been integrated into the utensil. With reference to FIG. 6, utensil 30 has a platform 32 identical to the platform of the first embodiment, including, for example, recess 34 having sidewall 36 and bottom wall 38.

Additionally, like the embodiment of FIGS. 4 and 5, the second embodiment includes a base 40. However, in the case of the second embodiment, base sidewall 42 is divided into an upper section 42a and a lower section 42b by a partition wall 44a. As in the first embodiment, base 40 is joined to the perimeter 46 of platform 32 in sealing relation. Accordingly, base sidewall 42a and partition wall 44a define a sealed chamber 48. Again as in the first embodiment, chamber 48 of the second embodiment is filled with a microwave-responsive gas 50 which glow discharges in the presence of microwaves in a microwave oven.

As best seen in FIG. 7, in the second embodiment, a stand 52 is defined by lower section 42b of the base sidewall and base lower wall 44b. As shown, base walls 44a, 44b and 42b define a second chamber 60, which in preferred form may be sealed and evacuated to imped flow of heat from chamber 48.

As in the case of the first embodiment, the utensil of the second embodiment includes at least one wall or part thereof of chamber 48 which is microwave and optically transparent or transmissive in order to permit ignition and observation of the glow discharge. Again in preferred form, the utensil may be made of a unitary construction featuring, for example, lead-based or borosilicate glass as required by operating temperature.

Although the invention has been described with respect to preferred embodiments, it will be appreciated by those skilled in the art that modification and alterations may be made in those embodiments without departing from the ture spirit and full scope of this invention.

I claim:

1. A detector for detecting the presence of microwave energy in a microwave oven, the detector comprising: an electrodeless chamber having at least a portion of a wall thereof which is optically transmissive, and a mixture of gas contained within the chamber which produces a light visible through the transmissive chamber wall when the detector is exposed to microwave energy in the oven, the mixture including neon and argon.

2. The detector of claim 1, wherein the gas mixture includes approximately 50% neon and approximately 50% argon.

3. The detector of claim 2, wherein the pressure of the gas mixture in the chamber is from 2 to 20 millimeters of mercury.

4. The detector of claim 3, wherein the chamber is formed of a borosilicate glass.

5. The detector of claim 4, further including a support which may be positioned in the oven for receiving the chamber.

6. A utensil for holding food in a microwave oven, the utensil comprising: a platform for receiving and retaining the food to be cooked; a base for supporting the platform in the oven, and a heater, thermally coupled to the platform, the heater including a chamber having at least a portion of a wall thereof which is optically transmissive, the chamber containing a gas which produces heat to assist cooking and produces a visible light that may be seen in the oven when the utensil is subjected to microwave energy.

7. The utensil of claim 5, wherein the heater gas is a mixture of neon and argon which produces a white light in responsive to microwave energy in the oven.

8. The utensil of claim 6, wherein the gas mixture includes approximately 50% neon and approximately 50% argon.

9. The utensil of claim 7, wherein the heater chamber has a upper wall formed, at least in part, by the utensil platform and lower wall and sidewalls formed, at least in part, by the utensil base.

10. The utensil of claim 8, wherein the heater chamber lower wall is formed by a partition spaced from the base lower wall, and wherein the utensil further including a thermal insulator separating the heater and the base lower wall, the insulator being formed by an evacuated volume adjacent the chamber lower wall opposite the base.

11. The utensil of claim 9, wherein the utensil is formed of an electrical insulating material and is a unitary construction.

12. The utensil of claim 10, wherein the utensil is made of a borosilicate glass.

* * * * *

UNITED STATES PATENT AND TRADEMARK OFFICE
CERTIFICATE OF CORRECTION

PATENT NO. : 4,529,855

DATED : July 16, 1985

INVENTOR(S) : Henry Fleck

Page 1 of 2

It is certified that error appears in the above-identified patent and that said Letters Patent is hereby corrected as shown below:

At column 4, beginning of line 63, change the word "whre" to --where--.

At column 5, line 34, after the word "transparent", change the word "of" to --or--.

At column 10, line 31, after the word "claim", change "5" to --6--.

At column 10, line 34, after the word "claim", change "6" to --7--.

At column 10, line 37, after the word "claim", change "7" to --8--.

At column 10, line 41, after the word "claim", change "8" to --9--.

At column 10, line 48, after the word "claim", change "9" to --10--.

UNITED STATES PATENT AND TRADEMARK OFFICE
CERTIFICATE OF CORRECTION

PATENT NO. : 4,529,855
DATED : July 16, 1985
INVENTOR(S) : Henry Fleck

It is certified that error appears in the above-identified patent and that said Letters Patent are hereby corrected as shown below:

At column 10, line 51, after the word "claim", change "10" to --11--.

At the title page, following "Assistant Examiner-M. M. Lateef", add --Attorney-Paul C. Scifo--.

Signed and Sealed this

Third Day of December 1985

[SEAL]

Attest:

DONALD J. QUIGG

Attesting Officer

Commissioner of Patents and Trademarks